United States Patent
Ookawa

(10) Patent No.: US 9,841,479 B2
(45) Date of Patent: Dec. 12, 2017

(54) MAGNETIC RESONANCE IMAGING APPARATUS AND MAGNETIC RESONANCE IMAGING METHOD

(71) Applicant: TOSHIBA MEDICAL SYSTEMS CORPORATION, Otawara-shi (JP)

(72) Inventor: Masashi Ookawa, Otawara Tochigi (JP)

(73) Assignee: TOSHIBA MEDICAL SYSTEMS CORPORATION, Otawara-shi, Tochigi-ken (JP)

( * ) Notice: Subject to any disclaimer, the term of this patent is extended or adjusted under 35 U.S.C. 154(b) by 540 days.

(21) Appl. No.: 14/587,152

(22) Filed: Dec. 31, 2014

(65) Prior Publication Data

US 2015/0204953 A1 Jul. 23, 2015

(30) Foreign Application Priority Data

Jan. 17, 2014 (JP) ................................. 2014-006998

(51) Int. Cl.
| | |
|---|---|
| *G01V 3/00* | (2006.01) |
| *G01R 33/54* | (2006.01) |
| *G01R 33/483* | (2006.01) |
| *G01R 33/28* | (2006.01) |
| *G01R 33/563* | (2006.01) |

(52) U.S. Cl.
CPC ....... *G01R 33/543* (2013.01); *G01R 33/4833* (2013.01); *G01R 33/288* (2013.01); *G01R 33/56366* (2013.01)

(58) Field of Classification Search
USPC ....................................................... 324/309
See application file for complete search history.

(56) References Cited

U.S. PATENT DOCUMENTS

| | | | | |
|---|---|---|---|---|
| 5,530,350 A * | 6/1996 | Dechene | .............. | G01N 24/085 324/306 |
| 2007/0273375 A1* | 11/2007 | Diehl | ................. | G01R 33/5612 324/309 |
| 2011/0018537 A1* | 1/2011 | Warntjes | ............ | G01R 33/5602 324/309 |
| 2013/0002249 A1* | 1/2013 | Wald | .................... | G01R 33/288 324/309 |
| 2013/0229177 A1* | 9/2013 | Bammer | .......... | G01R 33/56341 324/309 |
| 2013/0300414 A1* | 11/2013 | Guerin | ................. | G01R 33/288 324/309 |
| 2015/0070011 A1* | 3/2015 | Pfeuffer | ................. | G01R 33/36 324/307 |

FOREIGN PATENT DOCUMENTS

JP 2004-242948 9/2001

* cited by examiner

*Primary Examiner* — Rodney Fuller
(74) *Attorney, Agent, or Firm* — Nixon & Vanderhye P.C.

(57) ABSTRACT

A magnetic resonance imaging apparatus according to an embodiment includes a processor and a memory. The memory stores processor-executable instructions that, when executed by the processor, cause the processor to receive an operation of setting an application condition concerning a local excitation pulse that is a radio frequency (RF) pulse for local excitation applied to a local region different from an imaging region; generate a waveform of the local excitation pulse based on the application condition; and set an imaging condition such that an index value calculated from the waveform of the local excitation pulse does not exceed a limit value.

19 Claims, 6 Drawing Sheets

MAGNETIC RESONANCE IMAGING APPARATUS AND MAGNETIC RESONANCE IMAGING METHOD

CROSS-REFERENCE TO RELATED APPLICATIONS

This application is based upon and claims the benefit of priority from Japanese Patent Application No. 2014-006998, filed on Jan. 17, 2014; the entire contents of which are incorporated herein by reference.

FIELD

An embodiment described herein relates generally to magnetic resonance imaging apparatuses and magnetic resonance imaging methods.

BACKGROUND

Conventionally, in imaging methods with a magnetic resonance imaging apparatus, there have been methods that apply a radio frequency (RF) pulse as a pre-pulse (also referred to as a preparation pulse) before a pulse sequence for data collection is performed. The pre-pulse is used to add or remove a variety of information to or from an image. For example, in arterial spin labeling (ASL) method for imaging fluid such as blood and cerebrospinal fluid, a labeling pulse is applied as a pre-pulse to label the fluid that flows into an imaging region of a subject.

DETAILED DESCRIPTION

A magnetic resonance imaging (MRI) apparatus according to an embodiment includes a processor and a memory. The memory stores processor-executable instructions that, when executed by the processor, cause the processor to receive an operation of setting an application condition concerning a local excitation pulse that is a radio frequency (RF) pulse for local excitation applied to a local region different from an imaging region; generate a waveform of the local excitation pulse based on the application condition; and set an imaging condition such that an index value calculated from the waveform of the local excitation pulse does not exceed a limit value.

Figure 1:
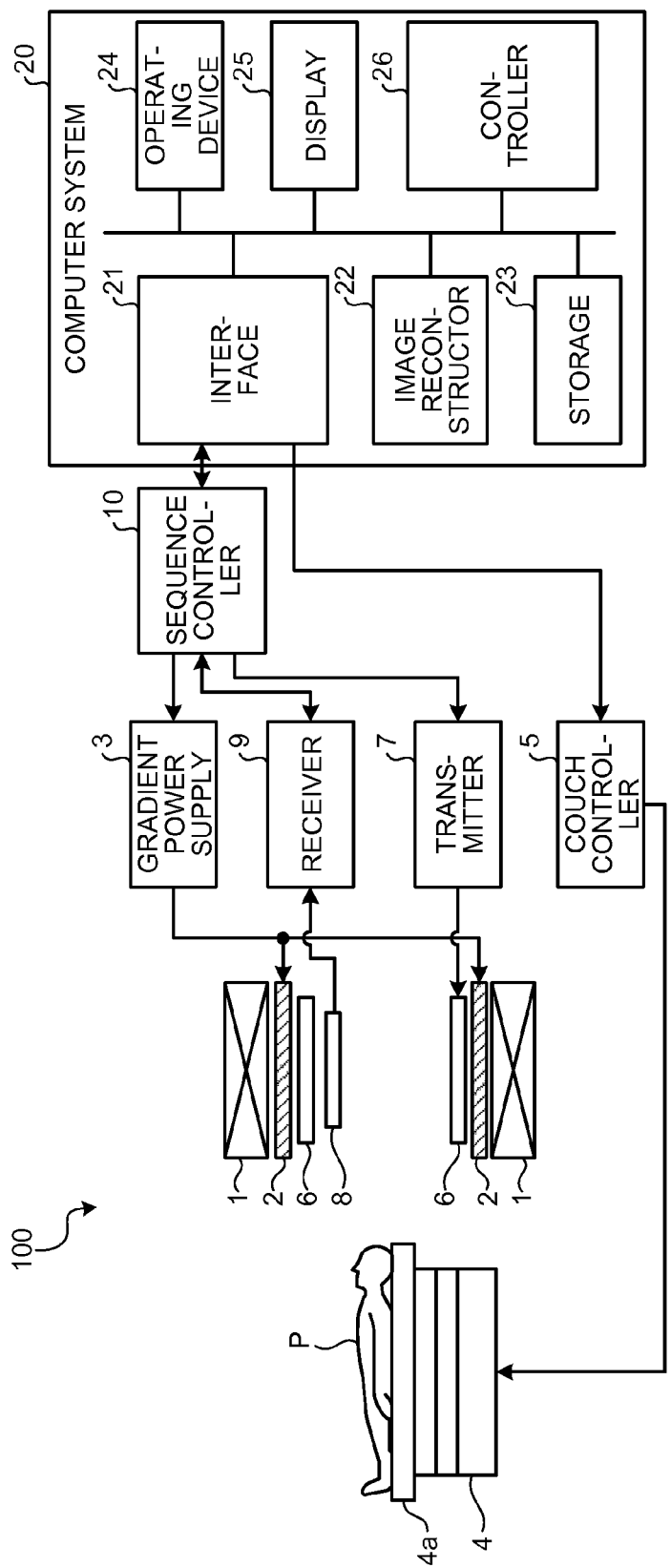
FIG. 1 is a block diagram illustrating an example of the configuration of a magnetic resonance imaging (MRI) apparatus according to an embodiment.

FIG. 1 is a block diagram illustrating an example of the configuration of an MRI apparatus 100 according to the embodiment. As illustrated in FIG. 1, the MRI apparatus 100 includes a static magnet 1, a gradient coil 2, a gradient power supply 3, a couch 4, a couch controller 5, a transmitting RF coil 6, a transmitter 7, a receiving RF coil 8, a receiver 9, a sequence controller 10, and a computer system 20, for example.

The static magnet 1 is a magnet formed in a hollow cylindrical shape, and in a void space on the inner side thereof, generates a uniform static magnetic field. As for the static magnet 1, a permanent magnet and a superconducting magnet are used, for example.

The gradient coil 2 is a coil formed in a hollow cylindrical shape and is disposed on the inner side of the static magnet 1. The gradient coil 2 is formed with a combination of three coils corresponding to respective axes of X, Y, and Z which are orthogonal to one another. The three coils each receive a supply of current individually from the gradient power supply 3 which will be described later, and generate a gradient magnetic field the magnetic field intensity of which varies along the respective axes of X, Y, and Z. Note that the direction of the z axis is defined to be the same as that of the static magnetic field. The gradient power supply 3 supplies the current to the gradient coil 2.

The gradient magnetic fields on the respective axes of X, Y, and Z generated by the gradient coil 2 correspond to a slice-selecting gradient magnetic field Gss, a phase-encoding gradient magnetic field Gpe, and a read-out gradient magnetic field Gro, respectively, for example. The slice-selecting gradient magnetic field Gss is used to determine a given cross-section. The phase-encoding gradient magnetic field Gpe is used to alter the phase of a magnetic resonance signal depending on a spatial location. The read-out gradient magnetic field Gro is used to alter the frequency of the magnetic resonance signal depending on the spatial location.

The couch 4 includes a couchtop 4a on which a subject P is placed, and under the control of the couch controller 5 which will be described later, inserts the couchtop 4a, in a state of the subject P being placed thereon, into a cavity (opening for imaging) of the gradient coil 2. Generally, the couch 4 is installed such that the longitudinal direction thereof is in parallel with the central axis of the static magnet 1. The couch controller 5 is a device that controls the couch 4 under the control of a controller 26, and drives the couch 4 to move the couchtop 4a in the longitudinal direction and up-and-down direction thereof.

The transmitting RF coil 6 is disposed on the inner side of the gradient coil 2, and with high-frequency pulse current supplied from the transmitter 7, generates a radio frequency (RF) pulse (high-frequency magnetic field pulse). The transmitter 7 supplies the high-frequency pulse current corresponding to a Larmor frequency to the transmitting RF coil 6. The receiving RF coil 8 is disposed on the inner side of the gradient coil 2 and receives a magnetic resonance signal emitted from the subject P by the influence of the above-described RF pulse. When the receiving RF coil 8 receives the magnetic resonance signal, the receiving RF coil 8 outputs the magnetic resonance signal to the receiver 9.

The receiver 9 generates magnetic resonance (MR) signal data based on the magnetic resonance signal output from the receiving RF coil 8. The receiver 9 generates the MR signal data by performing digital conversion on the magnetic resonance signal output from the receiving RF coil 8. The MR signal data is associated with information on spatial frequency in a phase-encode (PE) direction, in a read-out (RO) direction, and in a slice-encode (SE) direction, by the foregoing slice-selecting gradient magnetic field Gss, the phase-encoding gradient magnetic field Gpe, and the read-out gradient magnetic field Gro, respectively, and is disposed in k-space. When the MR signal data is generated, the receiver 9 sends the MR signal data to the sequence controller 10.

The sequence controller 10 drives, based on sequence execution data sent from the computer system 20, the gradient power supply 3, the transmitter 7, and the receiver 9 to execute a scan of the subject P. The sequence execution data here is the information that defines a pulse sequence indicative of a procedure to execute a scan of the subject P, such as the strength of power supply that the gradient power supply 3 supplies to the gradient coil 2 and the timing thereof, the intensity of an RF signal that the transmitter 7 sends to the transmitting RF coil 6 and the timing thereof, and the timing that the receiver 9 detects a magnetic resonance signal. After the sequence controller 10 drove the gradient power supply 3, the transmitter 7, and the receiver 9 based on the sequence execution data, when MR signal data is sent from the receiver 9, the sequence controller 10 transfers the MR signal data to the computer system 20.

The computer system 20 performs an overall control of the MRI apparatus 100. For example, the computer system 20 drives various modules of the MRI apparatus 100 to perform a scan of the subject P, the reconstruction of an image, and others. The computer system 20 includes an interface 21, an image reconstructor 22, a storage 23, an operating device 24, a display 25, and the controller 26.

The interface 21 controls the input and output of various signals exchanged with the sequence controller 10. For example, the interface 21 sends sequence execution data to the sequence controller 10 and receives MR signal data from the sequence controller 10. When the MR signal data is received, the interface 21 stores each MR signal data in the storage 23 for each subject P.

The image reconstructor 22 generates spectrum data or image data of desired nuclear spins inside the subject P by performing post-processing, that is, reconstruction processing such as Fourier transformation, on the MR signal data stored in the storage 23. Furthermore, the image reconstructor 22 stores the generated spectrum data or image data in the storage 23 for each subject P.

The storage 23 stores therein a variety of data, various computer programs, and others necessary for the processing executed by the controller 26 which will be described later. The storage 23 stores therein, for example, the MR signal data received by the interface 21, the spectrum data and the image data generated by the image reconstructor 22, and others, for each subject P. The storage 23 is a semiconductor memory device such as a random access memory (RAM), a read only memory (ROM), and a flash memory, and a storage device such as a hard disk and an optical disk, for example.

The operating device 24 receives various instructions and information inputs from an operator. As for the operating device 24, a pointing device such as a mouse and a trackball, a select device such as a mode-select switch, or an input device such as a keyboard can be used as appropriate.

The display 25 displays, under the control of the controller 26, a variety of information such as spectrum data or image data. As for the display 25, a display device such as a liquid crystal display can be used.

The controller 26 includes a processor such as a central processing unit (CPU), a memory, and others not depicted, and performs an overall control of the MRI apparatus 100. The memory stores processor-executable instructions that, when executed by the processor, cause the processor to perform processing which are described later as executed by modules included in the controller 26. The controller 26, by generating various sequence execution data based on an imaging condition input by the operator via the operating device 24, and sending the generated sequence execution data to the sequence controller 10, controls a scan, for example. Furthermore, when the MR signal data is sent from the sequence controller 10 as a result of the scan, the controller 26 controls the image reconstructor 22 to reconstruct an image based on the MR signal data.

The configuration of the MRI apparatus 100 in the embodiment has been explained in the foregoing. Under such a configuration, the MRI apparatus 100 in the embodiment includes a receiving module, a generating module, and a setting module. The receiving module receives an operation of setting an application condition concerning a local excitation pulse that is an RF pulse for local excitation applied to a local region different from an imaging region. The generating module generates a waveform of the local excitation pulse based on the application condition. The setting module sets an imaging condition such that an index value calculated from the waveform of the local excitation pulse does not exceed a limit value.

In the embodiment, exemplified is a situation in which the local excitation pulse is an RF pulse to add or remove a variety of information to or from an image to be imaged. For example, the MRI apparatus 100 in the embodiment can perform an imaging method that applies an RF pulse to add or remove a variety of information to or from an image to be imaged, as a pre-pulse, before a pulse sequence for data collection is executed. For example, in arterial spin labeling (ASL) in which fluid such as blood and cerebrospinal fluid is imaged, a labeling pulse to label the fluid that flows into an imaging region of a subject is applied as a pre-pulse.

In such an imaging method, depending on the target region of imaging and the purpose of imaging, there may be cases in which local excitation by a pre-pulse is required. For example, in ASL, there are cases in which selectively labeling blood in a part of blood vessels out of a plurality of blood vessels is required.

Consequently, the MRI apparatus 100 in the embodiment receives an operation of setting an application condition concerning a pre-pulse for local excitation. Furthermore, the MRI apparatus 100 generates at least one of the waveform of a pre-pulse for local excitation and the waveform of a gradient magnetic field that is applied to the subject along with the pre-pulse, and in accordance with the generated waveform, sets an imaging condition for imaging an image using the pre-pulse and a pulse sequence such that an index value relevant to the pre-pulse or the gradient magnetic field does not exceed a limit value. Thus, at the time the application condition of the pre-pulse for local excitation is set, the imaging condition is optimized automatically depending on the application condition. Consequently, in accordance with the embodiment, the pre-pulse for local excitation can be set easily.

The following describes in detail the MRI apparatus 100 in the embodiment.

Figure 2:
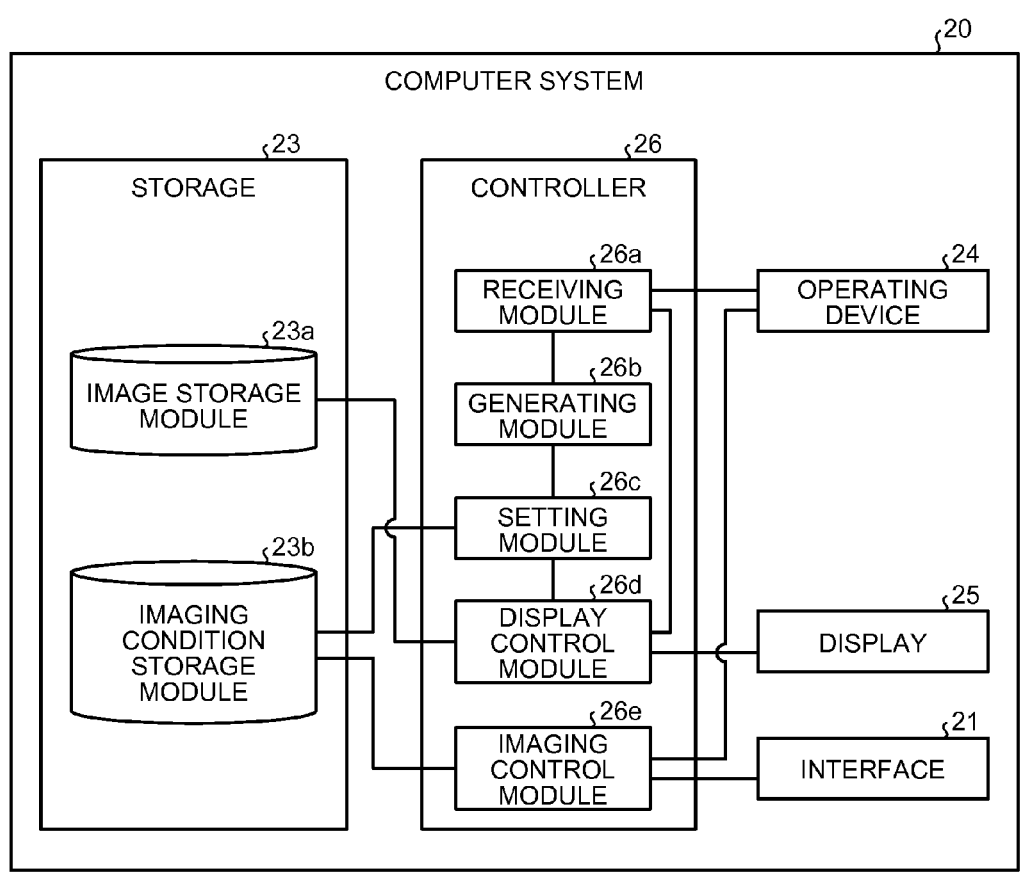
FIG. 2 is a block diagram illustrating an example of the configuration of the MRI apparatus in the embodiment in detail.

FIG. 2 is a block diagram illustrating an example of the configuration of the MRI apparatus 100 in the embodiment in detail. FIG. 2 illustrates, out of the various modules of the computer system 20 illustrated in FIG. 1, the interface 21, the storage 23, the operating device 24, the display 25, and the controller 26.

As illustrated in FIG. 2, the storage 23 includes an image storage module 23a and an imaging condition storage module 23b, for example.

The image storage module 23*a* stores therein the image data generated by the image reconstructor 22. For example, the image storage module 23*a* stores therein an image for positioning and an image for diagnosis on which a subject is imaged.

The imaging condition storage module 23*b* stores therein an imaging condition concerning various imaging methods and various pulse sequences for each imaging protocol determined depending on the target region of imaging and the purpose of imaging. The imaging condition here includes a plurality of imaging parameters. For example, the imaging condition includes a flip angle (FA), a bandwidth (BW), and a type of waveform (WF) of an RF pulse for excitation in a pulse sequence for data collection; a repetition time (TR), an echo time (TE), and an inversion time (TI) of data collection in the pulse sequence for data collection; and the size (length, width, and thickness) and position of an imaging region. The imaging condition further includes the flip angle, the bandwidth, and the type of waveform of a pre-pulse for local excitation, and the size (length, width, and thickness) and position of an application region thereof, for example.

Furthermore, the controller 26 includes a receiving module 26*a*, a generating module 26*b*, a setting module 26*c*, a display control module 26*d*, and an imaging control module 26*e*, for example.

The receiving module 26*a* receives an operation of setting an application condition concerning a pre-pulse for local excitation that is applied to a subject before a pulse sequence for data collection is executed. Specifically, the receiving module 26*a* receives, via the operating device 24, an operation of setting an application condition concerning a pre-pulse for local excitation from the operator.

For example, the receiving module 26*a* receives, via a graphical user interface (GUI) for setting an imaging condition, an operation of setting an application region of a pre-pulse and an imaging region of a diagnostic image. For example, the GUI displays an image of a region of a subject as an image for positioning, and based on the image, the GUI receives an operation of setting the application region of a pre-pulse and the imaging region of a diagnostic image. Furthermore, the GUI displays each of the imaging parameters and the setting values thereof included in the imaging condition, and the GUI receives an operation of inputting the setting values of the respective imaging parameters, for example.

The receiving module 26*a*, for example, receives an operation of setting the application region of a pre-pulse on an image of a region of a subject. The receiving module 26*a* further receives an operation of altering the application region of a pre-pulse on the image of the region of the subject. The image of the region of the subject here is read out from the image storage module 23*a* by the display control module 26*d* which will be described later, and is displayed on the display 25.

Figure 3:
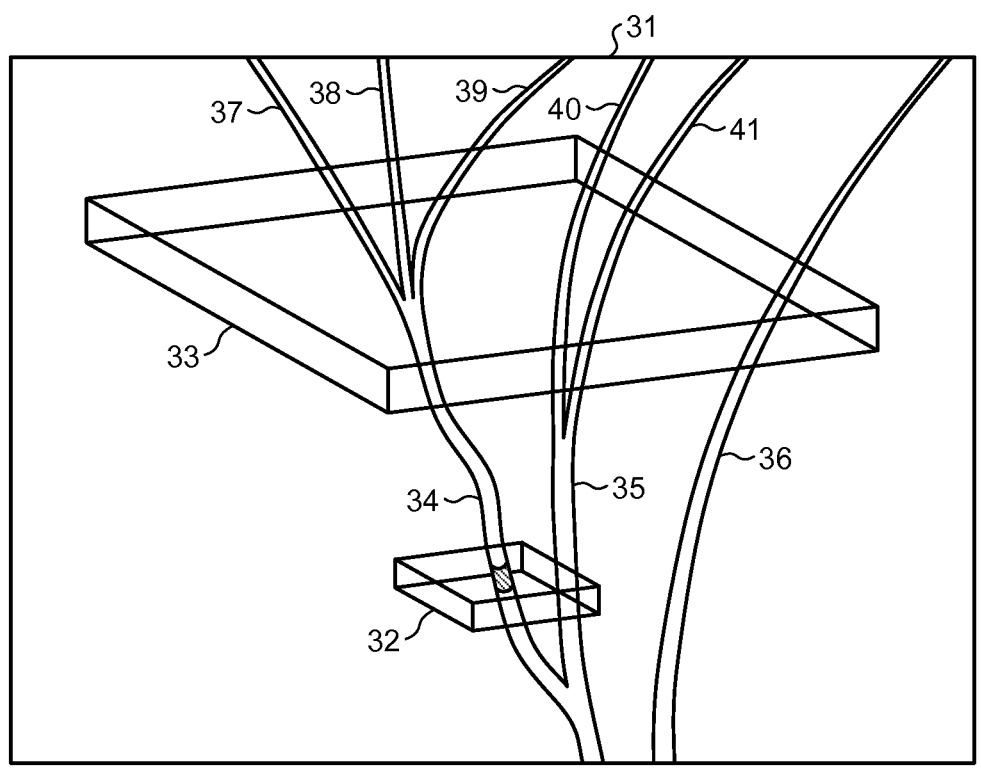
FIG. 3 is a diagram for explaining the setting of a pre-pulse for local excitation in the embodiment.

FIG. 3 is a diagram for explaining the setting of a pre-pulse for local excitation in the embodiment. Note that, as an example of a pre-pulse for local excitation, a situation of setting an application region of a labeling pulse used in ASL is exemplified here.

For example, as illustrated in FIG. 3, in the setting of a labeling pulse in ASL, used is an image 31 of blood vessels of a subject. The image 31 is a vascular image having positional information such as a rendering image of blood vessels, for example. In the image 31 illustrated in FIG. 3, it is assumed that the lower side thereof is upstream blood flow and the upper side thereof is downstream blood flow.

The receiving module 26*a* then receives an operation of setting an application region of a pre-pulse for local excitation on the image 31, and an operation of setting an imaging region of a diagnostic image, on the image 31.

For example, as illustrated in FIG. 3, the receiving module 26*a* receives, via the operating device 24, an operation of setting a region of interest (ROI) 32 for local excitation which represents an application region of a pre-pulse for local excitation on the image 31. The ROI 32 for local excitation here is a graphic of a flat plate shape having a thickness and represents the size and position of the application region to which a pre-pulse is applied, for example. The receiving module 26*a* further receives an operation of altering the size and position of the ROI 32 for local excitation on the image 31. By receiving this operation, the size and position of the application region of a pre-pulse for local excitation are altered.

Furthermore, as illustrated in FIG. 3, the receiving module 26*a* receives, via the operating device 24, an operation of setting an ROI 33 for imaging which represents an imaging region of a diagnostic image, for example. The ROI 33 for imaging here is, as the same as the ROI 32 for local excitation, a graphic of a flat plate shape having a thickness and represents the size and position of an imaging region, for example.

When selectively labeling blood in a part of blood vessels out of a plurality of blood vessels, for example, on the upstream side in the image 31, the ROI 32 for local excitation is set such that only the part of the blood vessels is included. For example, as illustrated in FIG. 3, the ROI 32 for local excitation is set such that only a blood vessel 34 is included out of a plurality of blood vessels 34 to 36 on the upstream side in the image 31. Note that a part of the blood vessels here may be the blood vessels of two or more.

Meanwhile, in this case, the ROI 33 for imaging is set, on the downstream side in the image 31, so as to include a wider range as compared with the ROI 32 for local excitation. For example, as illustrated in FIG. 3, the ROI 33 for imaging is set, on the downstream side in the image 31, such that all blood vessels 37 to 41 branching from the blood vessels 34 to 36 are included. By setting the respective ROIs in this manner, in the image of the imaging region, only the blood vessel to which the ROI 32 for local excitation is set is labeled and clearly visualized out of the blood vessels to which the ROI 33 for imaging is set.

While the situation of setting an application region of a labeling pulse used in ASL has been exemplified here, the pre-pulse for local excitation is not limited to this. For example, the pre-pulse for local excitation may be a pre-pulse used for specific imaging methods. The pre-pulse used for specific imaging methods here includes an inversion pulse used for perfusion imaging, for example.

Referring back to FIG. 2, the generating module 26*b* generates, based on an application condition set by an operation received by the receiving module 26*a*, at least one of the waveform of a pre-pulse for local excitation and the waveform of a gradient magnetic field applied to a subject along with the pre-pulse. Specifically, the generating module 26*b* determines, in accordance with an operation received by the receiving module 26*a*, to generate any one of the waveform of a pre-pulse and the waveform of a gradient magnetic field, or both.

For example, if an operation received by the receiving module 26*a* is the operation of setting a flip angle of a pre-pulse for local excitation, the generating module 26*b* generates the waveform of the pre-pulse. Furthermore, if an operation received by the receiving module 26*a* is the operation of setting the size and position of an application region for local excitation, the generating module 26b generates the waveform of a gradient magnetic field, for example. Note that, if an operation received by the receiving module 26a is the operation of altering both the flip angle and the application region of a pre-pulse for local excitation, the generating module 26b generates both the waveform of the pre-pulse and the waveform of a gradient magnetic field. Furthermore, if the application region of a pre-pulse for local excitation is altered, the generating module 26b generates, reflecting the alteration by the operation, the waveform of a local excitation pulse or the waveform of a gradient magnetic field.

The setting module 26c sets an imaging condition of imaging using a pre-pulse for local excitation and the pulse sequence, in accordance with the waveform generated by the generating module 26b, such that an index value relevant to the pre-pulse for local excitation or a gradient magnetic field applied along with the pre-pulse does not exceed a limit value.

The index value here is, for example, a specific absorption rate (SAR) obtainable from the waveform of a pre-pulse. The setting module 26c obtains, based on the waveform of the pre-pulse generated by the generating module 26b, SAR by calculating an integrated value of the waveform, for example. Furthermore, the index value is, for example, a time change rate of magnetic field intensity (dB/dt) obtainable from the waveform of a gradient magnetic field. For example, the setting module 26c obtains, based on the waveform of the gradient magnetic field generated by the generating module 26b, dB/dt by calculating a change rate of the gradient magnetic field per unit time. Moreover, the index value is, for example, an index value concerning a constraint condition of hardware implemented in the apparatus. For example, the index value is the intensity of gradient magnetic field, and the limit value in this case is a maximum gradient magnetic field that is the restraint condition of the hardware.

For example, the setting module 26c determines, in accordance with the order of priority and dependency relation predefined, an imaging parameter to be the target of setting. For example, the setting module 26c determines, depending on the type of pulse sequence for data collection, an imaging parameter to be the target of setting. For example, when the pulse sequence is steady state free precession (SSFP), the setting module 26c determines the target of setting to be the flip angle of an RF pulse for data collection. Furthermore, when the pulse sequence is fast advanced spin echo (FASE), for example, the setting module 26c determines the target of setting to be the repetition time of data collection.

Furthermore, the setting module 26c determines, depending on the type of limit value of SAR, an imaging parameter that is the target of setting, for example. Generally, examples of the limit value of SAR include a limit value concerning an average value of SAR for 6 minutes and a limit value concerning an average value of SAR for 10 seconds. Thus, when the SAR obtained from the waveform of a pre-pulse exceeds the limit value concerning the average value of SAR for 6 minutes, for example, the setting module 26c determines the repetition time of data collection to be the target of setting. Furthermore, when the SAR obtained from the waveform of a pre-pulse exceeds the limit value concerning the average value of SAR for 10 seconds, for example, the setting module 26c determines the flip angle of an RF pulse for data collection to be the target of setting.

The setting module 26c may determine an imaging parameter selected by the operator to be the target of setting, for example. In this case, the setting module 26c, for example, controls the display 25 to display the imaging parameters that can be altered such as the repetition time of data collection, the flip angle of RF pulse for data collection, the bandwidth of a pre-pulse, the type of waveform of a pre-pulse, and others, and receives an operation of selecting any one of the imaging parameters out of the foregoing.

The setting module 26c then sets the imaging condition such that the index value does not exceed a limit value and is closest to the limit value, for example. That is, the setting module 26c sets, on the imaging parameter determined to be the target of setting, an optimal value in a range that the index value relevant to a pre-pulse for local excitation or a gradient magnetic field applied along with the pre-pulse does not exceed the limit value.

For example, when the SAR obtained from the waveform of a pre-pulse exceeded a limit value, the setting module 26c sets the length of repetition time of data collection, the angle of flip angle of RF pulse for data collection, the bandwidth of a pre-pulse, and the type of waveform of a pre-pulse such that the SAR does not exceed the limit value and is closest to the limit value. Furthermore, when the dB/dt obtained from the waveform of a gradient magnetic field exceeded a limit value, for example, the setting module 26c sets the bandwidth of a pre-pulse and the type of waveform of a pre-pulse such that the dB/dt does not exceed the limit value and is closest to the limit value.

The display control module 26d controls the display 25 to display an image of a region of a subject. Specifically, the display control module 26d receives an instruction to start setting an imaging condition from the operator via the receiving module 26a, and in accordance with that, the display control module 26d controls the display 25 to display the GUI for setting the imaging condition. At this time, the display control module 26d reads out the imaging condition selected by the operator from the imaging condition storage module 23b, and display the content of the read-out imaging condition on the GUI.

Furthermore, the display control module 26d receives an instruction to start setting a pre-pulse for local excitation from the operator via the receiving module 26a, and in accordance with that, the display control module 26d reads out an image for positioning specified by the operator from the image storage module 23a and display the image on the display 25. The display control module 26d then, in accordance with an operation received by the receiving module 26a, controls the display 25 to display the ROI for local excitation representing the application region of a pre-pulse for local excitation and the ROI 33 for imaging on the image for positioning.

The display control module 26d here controls the display 25 to display a portion of the region to which the application region of a local pre-pulse is set out of the region of the subject in the image for positioning, in a display form different from the other portion, for example. As illustrated in FIG. 3, for example, the display control module 26d controls the display 25 to display the portion of the region to which the application region of a pre-pulse is set out of the blood vessel 34 in the image for positioning, in a color different from the other portion. The display control module 26d may alter the pattern of the portion to which the application region of a pre-pulse is set. Furthermore, the display control module 26d may make the portion to which the application region of a pre-pulse is set blink.

By displaying the portion to which the application region of a pre-pulse is set in a display form different from the other portion as in the foregoing, the operator can visually comprehend easily whether the application region of a pre-pulse is set at a desired position. For example, at the time the imaging by ASL is performed, out of a plurality of blood vessels, a blood vessel for which the blood is desired to be labeled can be selected clearly.

Subsequently, when the application region of a pre-pulse is altered by the operation received by the receiving module 26*a*, for example, the display control module 26*d* changes the display of the application region of a pre-pulse in accordance with the imaging condition set by the setting module 26*c*. For example, when the application region is set in a size or at a position which makes SAR or dB/dt exceed the limit value, after the imaging condition is optimized by the setting module 26*c*, the display control module 26*d* displays the application region of a pre-pulse based on the optimized imaging condition. Consequently, even when the operator sets the application region of a pre-pulse too large, the application region is returned to an optimal size automatically.

Note that the image for positioning is an image including positional information in the depth direction generated from volume data of a subject. For example, the image for positioning is an image obtained by rendering the volume data of the subject. The volume data here is collected by executing a 3D sequence that encodes in the respective directions of the read-out direction, the phase-encode direction, and the slice direction, for example. Examples of the rendering here include ray-tracing and volume rendering. As in the foregoing, by the use of an image including the positional information in the depth direction as the image for positioning, the position of the application region of a pre-pulse can be represented three-dimensionally. This enables the operator to comprehend more clearly a range in which a blood vessel and the application region cross each other.

The imaging control module 26*e* executes, based on the imaging condition set by the setting module 26*c*, imaging by using a pre-pulse for local excitation and a pulse sequence for data collection. Specifically, when an instruction to start imaging is received from the operator via the operating device 24, the imaging control module 26*e* reads out the imaging condition specified by the operator from the imaging condition storage module 23*b*. The imaging control module 26*e* then executes a scan by generating sequence execution data based on the read-out imaging condition, and sending the generated sequence execution data to the sequence controller 10.

Figure 4:
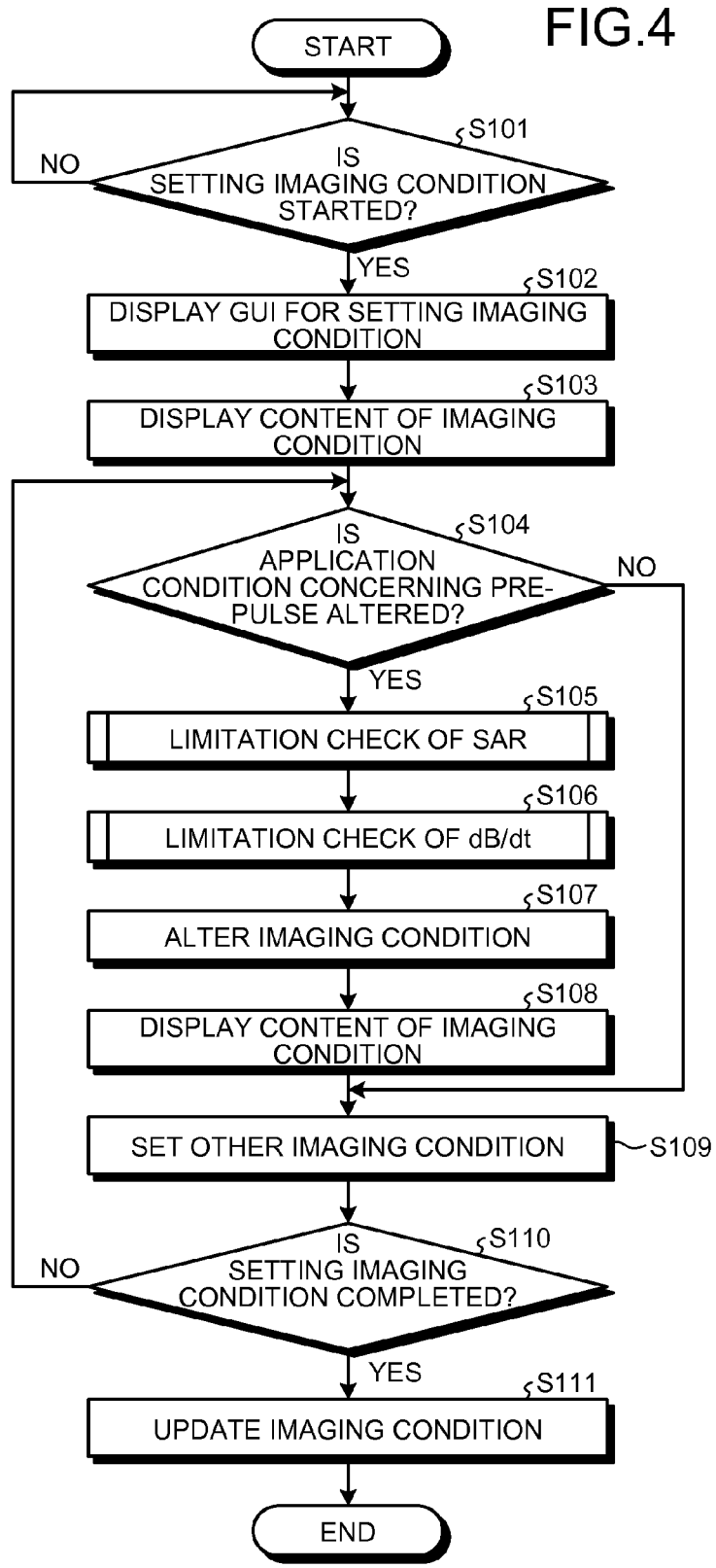
FIG. 4 is a flowchart illustrating a processing procedure of setting an imaging condition performed by the MRI apparatus in the embodiment.

FIG. 4 is a flowchart illustrating a processing procedure of setting an imaging condition performed by the MRI apparatus 100 in the embodiment. For example, as illustrated in FIG. 4, in the MRI apparatus 100 in the embodiment, when the display control module 26*d* receives an instruction to start setting an imaging condition from the operator via the receiving module 26*a* (Yes at Step S101), the display control module 26*d* controls the display 25 to display the GUI for setting an imaging condition (Step S102). Furthermore, the display control module 26*d* reads out the imaging condition selected by the operator from the imaging condition storage module 23*b*, and displays the content of the read-out imaging condition on the GUI (Step S103).

Subsequently, when an operation of altering the application condition concerning a pre-pulse for local excitation is received by the receiving module 26*a* (Yes at Step S104), the generating module 26*b* and the setting module 26*c* perform the limitation check of SAR and the limitation check of dB/dt (Step S105 and Step S106). The processing procedures for the processes concerning the limitation check of SAR and the limitation check of dB/dt will be described later in detail.

The setting module 26*c* then, based on the result of the limitation check of SAR and the limitation check of dB/dt, alters the imaging condition (Step S107). Thereafter, the display control module 26*d* displays the content of the altered imaging condition on the GUI (Step S108).

If the operation of altering the application condition concerning the pre-pulse for local excitation is not received from the operator (No at Step S104), the receiving module 26*a* receives an operation of setting other imaging conditions (Step S109).

As in the foregoing, until an instruction to finish the setting of the imaging condition is received by the receiving module 26*a* (No at Step S110), the above-described procedure of Step S104 to Step S109 is repeated. Then, when the instruction to finish the setting of the imaging condition is received (Yes at Step S110), the setting module 26*c* updates the imaging condition stored in the imaging condition storage module 23*b* with the content that is set at that point in time (Step S111).

Figure 5:
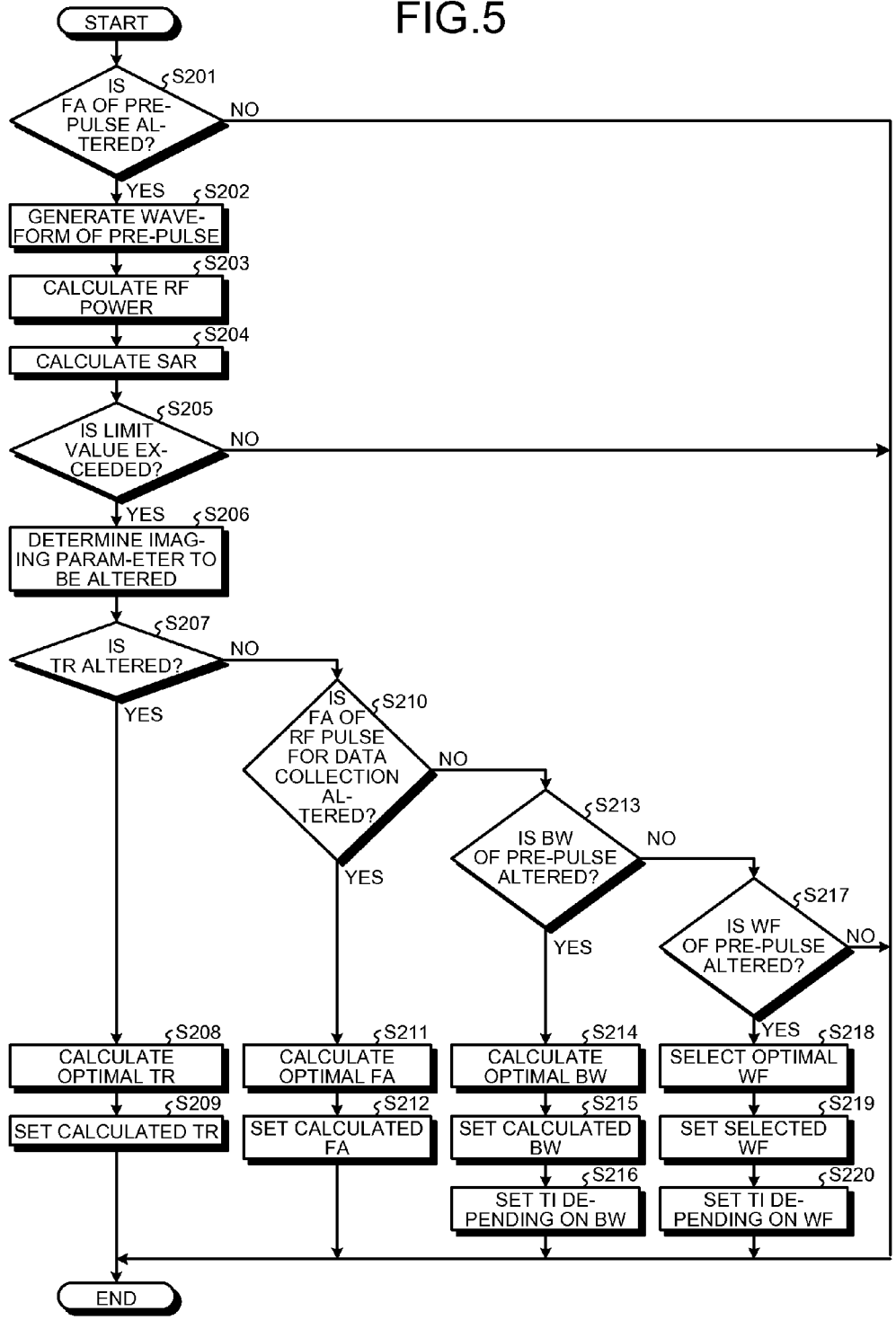
FIG. 5 is a flowchart illustrating a processing procedure of a process concerning a limitation check of a specific absorption rate (SAR) indicated in FIG. 4.

FIG. 5 is a flowchart illustrating a processing procedure of the process concerning the limitation check of SAR indicated in FIG. 4. For example, as illustrated in FIG. 5, when the flip angle (FA) of the pre-pulse for local excitation is altered (Yes at Step S201), the generating module 26*b* generates the waveform of the pre-pulse (Step S202).

Next, the setting module 26*c* calculates an RF power based on the waveform of the pre-pulse generated by the generating module 26*b* (Step S203), and then calculates SAR from the RF power (Step S204). The setting module 26*c* then determines whether the calculated SAR exceeds a limit value (Step S205). If the SAR exceeds the limit value (Yes at Step S205), the setting module 26*c* determines the imaging parameter to be altered (Step S206).

Now, for example, when the repetition time (TR) of data collection in the pulse sequence for data collection is altered (Yes at Step S207), the setting module 26*c* calculates an optimal repetition time based on the SAR obtained from the RF power (Step S208), and then sets the calculated repetition time as the imaging condition (Step S209).

For example, when the flip angle (FA) of the RF pulse for data collection is altered (Yes at Step S210), the setting module 26*c* calculates an optimal flip angle based on the SAR obtained from the RF power (Step S211), and then sets the calculated flip angle as the imaging condition (Step S212).

Furthermore, for example, when the bandwidth (BW) of the pre-pulse for local excitation is altered (Yes at Step S213), the setting module 26*c* calculates an optimal bandwidth based on the SAR obtained from the RF power (Step S214), and then sets the calculated bandwidth as the imaging condition (Step S215). Moreover, the setting module 26*c* sets the inversion time (TI) depending on the calculated bandwidth (Step S216).

Furthermore, for example, when the type of waveform (WF) of the pre-pulse for local excitation is altered (Yes at Step S217), the setting module 26*c* selects an optimal type of waveform based on the SAR obtained from the RF power (Step S218), and then sets the selected type of waveform as the imaging condition (Step S219). Moreover, the setting module 26*c* sets the inversion time (TI) depending on the selected type of waveform (Step S220).

Figure 6:
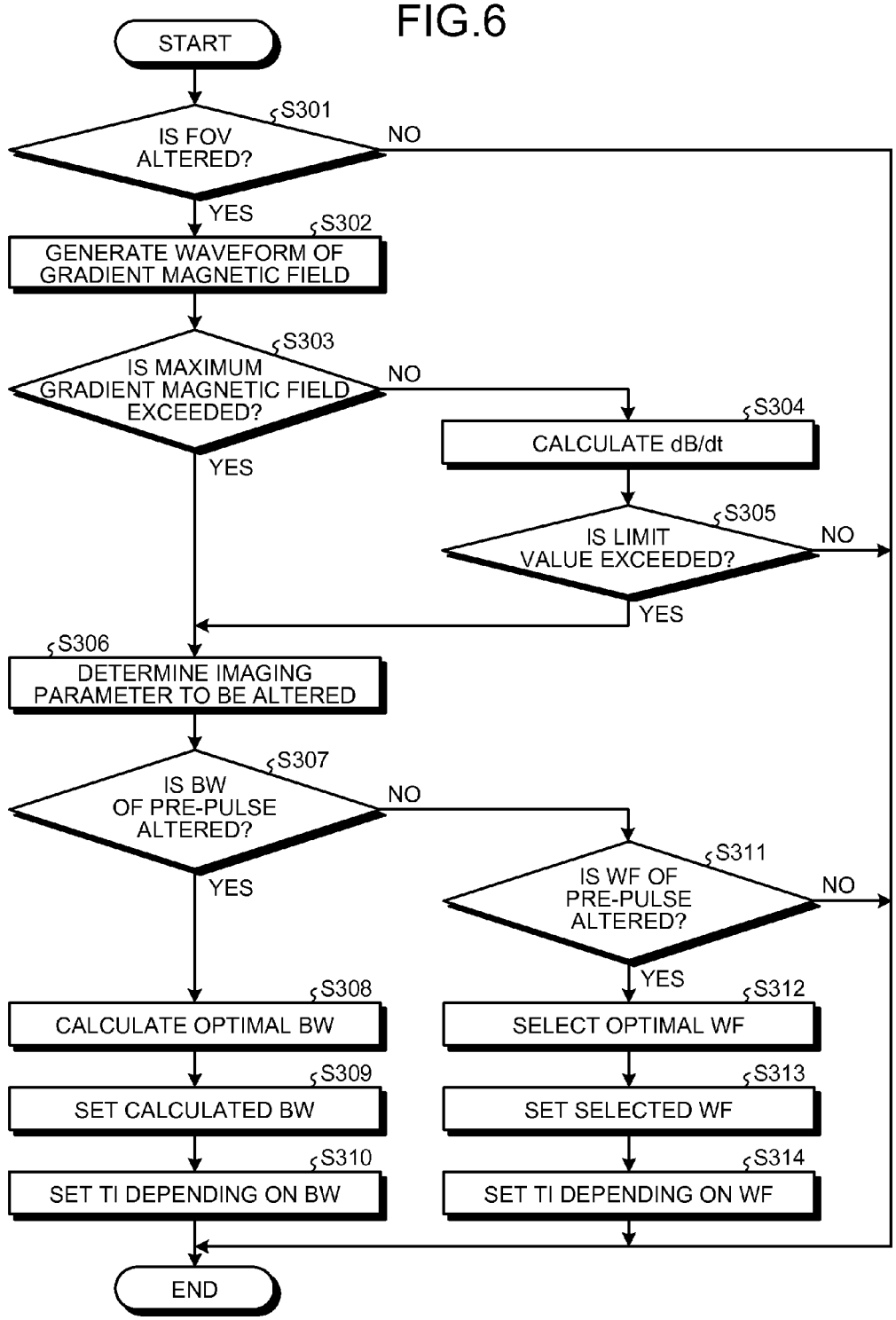
FIG. 6 is a flowchart illustrating a processing procedure of a process concerning a limitation check of dB/dt indicated in FIG. 4.

FIG. 6 is a flowchart illustrating a processing procedure of the process concerning the limitation check of dB/dt indicated in FIG. 4. For example, as illustrated in FIG. 6, when the application region (field of view (FOV)) of a pre-pulse for local excitation is altered (Yes at Step S301), the generating module 26b generates the waveform of the gradient magnetic field applied to the subject along with the pre-pulse (Step S302).

The setting module 26c then determines whether the gradient magnetic field exceeds a maximum gradient magnetic field that is a constraint condition of hardware (Step S303). If the gradient magnetic field does not exceed the maximum gradient magnetic field (No at Step S303), the setting module 26c calculate dB/dt based on the waveform of the gradient magnetic field generated by the generating module 26b (Step S304).

The setting module 26c then determines whether the calculated dB/dt exceeds a limit value (Step S305). If the dB/dt exceeds the limit value (Yes at Step S305), the setting module 26c determines the imaging parameter to be altered (Step S306). Furthermore, if the gradient magnetic field also exceeds the maximum gradient magnetic field (Yes at Step S303), the setting module 26c determines the imaging parameter to be altered (Step S306).

Now, for example, when the bandwidth (BW) of the pre-pulse for local excitation is altered (Yes at Step S307), the setting module 26c calculates an optimal bandwidth based on the SAR obtained from the RF power (Step S308), and then sets the calculated bandwidth as the imaging condition (Step S309). Furthermore, the setting module 26c sets the inversion time (TI) depending on the calculated bandwidth (Step S310).

Moreover, for example, when the type of waveform (WF) of the pre-pulse for local excitation is altered (Yes at Step S311), the setting module 26c selects an optimal type of waveform based on the SAR obtained from the RF power (Step S312), and then sets the selected type of waveform as the imaging condition (Step S313). Furthermore, the setting module 26c sets the inversion time (TI) depending on the selected type of waveform (Step S314).

As in the foregoing, in the embodiment, the receiving module 26a receives an operation of setting an application condition concerning a pre-pulse for local excitation applied to a subject before a pulse sequence for data collection is executed. Furthermore, the generating module 26b generates, based on the set application condition, at least one of the waveform of the pre-pulse and the waveform of a gradient magnetic field that is applied to the subject along with the pre-pulse. The setting module 26c then sets, depending on the waveform generated by the generating module 26b, the imaging condition of imaging using the pre-pulse and the pulse sequence such that an index value relevant to the pre-pulse or the gradient magnetic field does not exceed a limit value.

Consequently, in accordance with the embodiment, when the application condition of a pre-pulse for local excitation is set, the imaging condition is optimized depending on the application condition, whereby the pre-pulse for local excitation can be set easily. Thus, since the pre-pulse for local excitation and the imaging condition relevant thereto are optimized, the imaging condition can have a high degree of freedom. As a result of this, more number of imaging conditions the operator requires can be implemented, and thus the degree of freedom of an image that can be imaged can be enhanced. Furthermore, since the operator is enabled to set easily a pre-pulse for local excitation in a clinical point of view, a better image can be obtained.

In the embodiment, as the method of exciting a region locally with a local excitation pulse (local excitation), used is a method of narrowing down the region to be excited by altering an RF pulse for excitation and the bandwidth and waveform of a gradient magnetic field, for example. Furthermore, when the transmitting RF coil 6 has a plurality of transmission channels, used is a method of generating a high-frequency magnetic field (B1 magnetic field) only in a specific region by independently controlling the intensity and phase of RF pulses transmitted via the respective transmission channels, for example.

Moreover, in the embodiment, as the method to calculate SAR, used is a method in which the SAR is calculated from the RF power that is output from the transmitter 7 to the transmitting RF coil 6 (pulse energy method), for example. Furthermore, when a high-frequency magnetic field is generated in a specific region by a plurality of transmission channels, used is a method in which intensity distribution of a high-frequency magnetic field is estimated by simulation prior to the imaging and the SAR is calculated based on the estimated intensity distribution.

In accordance with at least one of the embodiments in the foregoing, an RF pulse for local excitation can be set easily.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
    a processor; and
    a memory that stores processor-executable instructions that, when executed by the processor, cause the processor to:
    receive an operation of setting an application condition concerning a local excitation pulse that is a radio frequency (RF) pulse for local excitation applied to a local region different from an imaging region;
    generate a waveform of the local excitation pulse based on the application condition; and
    set an imaging condition such that an index value calculated from the waveform of the local excitation pulse does not exceed a limit value.

2. The magnetic resonance imaging apparatus according to claim 1, wherein, in setting the imaging condition, the processor sets the imaging condition such that the index value calculated from the waveform of the local excitation pulse does not exceed the limit value and is closest to the limit value.

3. The magnetic resonance imaging apparatus according to claim 1, wherein the application condition is a flip angle of the local excitation pulse.

4. The magnetic resonance imaging apparatus according to claim 1, wherein the index value calculated from the waveform of the local excitation pulse is a specific absorption rate (SAR).

5. The magnetic resonance imaging apparatus according to claim 1, wherein the index value calculated from the waveform of the local excitation pulse is an index value concerning a constraint condition of hardware implemented in the apparatus.

6. The magnetic resonance imaging apparatus according to claim 1, wherein, in generating the waveform of the local excitation pulse, the processor further generates a waveform of a gradient magnetic field applied to a subject along with the local excitation pulse based on the application condition, and, in setting the imaging condition, the processor sets the imaging condition such that an index value calculated from the waveform of the gradient magnetic field does not exceed a limit value.

7. The magnetic resonance imaging apparatus according to claim 6, wherein, in setting the imaging condition, the processor sets the imaging condition such that the index value calculated from the waveform of the gradient magnetic field does not exceed the limit value and is closest to the limit value.

8. The magnetic resonance imaging apparatus according to claim 6, wherein the application condition is an application region of the local excitation pulse.

9. The magnetic resonance imaging apparatus according to claim 6, wherein the index value calculated from the waveform of the gradient magnetic field is dB/dt.

10. The magnetic resonance imaging apparatus according to claim 6, wherein the index value calculated from the waveform of the gradient magnetic field is an index value concerning a constraint condition of hardware implemented in the apparatus.

11. The magnetic resonance imaging apparatus according to claim 1, wherein the local excitation pulse is a labeling pulse that labels fluid that flows into an imaging region of a subject.

12. The magnetic resonance imaging apparatus according to claim 1, wherein the local excitation pulse is a pre-pulse used for a specific imaging method.

13. The magnetic resonance imaging apparatus according to claim 1, wherein, in receiving the operation of setting the application condition, the processor receives an operation of setting or altering an application condition of the local excitation pulse, and, in generating the waveform of the local excitation pulse, the processor generates the waveform of the local excitation pulse in accordance with the operation.

14. The magnetic resonance imaging apparatus according to claim 13, wherein, in generating the waveform of the local excitation pulse, the processor generates the waveform of the local excitation pulse by reflecting the alteration by the operation when the application condition is altered.

15. The magnetic resonance imaging apparatus according to claim 13, wherein the processor further controls a display to display an image of a region of a subject, wherein, in receiving the operation of setting the application condition, the processor receives the operation of setting or altering the application region of the local excitation pulse based on the image.

16. The magnetic resonance imaging apparatus according to claim 15, wherein, in controlling the display, the processor controls the display to display a portion of the region to which the application region is set in a display form different from that of the other portion.

17. The magnetic resonance imaging apparatus according to claim 16, wherein, in controlling the display, the processor controls the display to change a display of the application region in accordance with the imaging condition when the application region is altered.

18. The magnetic resonance imaging apparatus according to claim 15, wherein the image is an image including positional information in a depth direction generated from volume data of the subject.

19. A magnetic resonance imaging method comprising:

receiving an operation of setting an application condition concerning a local excitation pulse that is a radio frequency (RF) pulse for local excitation applied to a local region different from an imaging region;

generating a waveform of the local excitation pulse based on the application condition; and setting an imaging condition such that an index value calculated from the waveform of the local excitation pulse does not exceed a limit value.

* * * * *